(12) United States Patent
Huang et al.

(10) Patent No.: US 11,569,105 B2
(45) Date of Patent: Jan. 31, 2023

(54) MULTI-FLIP SEMICONDUCTOR DIE SORTER TOOL

(71) Applicant: Taiwan Semiconductor Manufacturing Company Limited, Hsinchu (TW)

(72) Inventors: Chih-Hung Huang, Hsinchu County (TW); Cheng-Lung Wu, Miaoli County (TW); Zheng-Lin He, Hsinchu (TW); Yang-Ann Chu, Hsinchu (TW); Jiun-Rong Pai, Jhubei (TW); Hsuan Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 408 days.

(21) Appl. No.: 16/901,595

(22) Filed: Jun. 15, 2020

(65) Prior Publication Data

US 2021/0391197 A1    Dec. 16, 2021

(51) Int. Cl.
*H01L 21/67* (2006.01)
*G01R 31/01* (2020.01)
*B07C 5/34* (2006.01)
*H01L 21/677* (2006.01)

(52) U.S. Cl.
CPC ...... *H01L 21/67271* (2013.01); *B07C 5/3412* (2013.01); *G01R 31/01* (2013.01); *H01L 21/67703* (2013.01)

(58) Field of Classification Search
CPC ......... H01L 21/67271; H01L 21/67703; B07C 5/3412; G01R 31/01
See application file for complete search history.

(56) References Cited

U.S. PATENT DOCUMENTS

| 3,847,284 | A | * | 11/1974 | Wiesler | B07C 5/344 |
|||||| 209/3.3 |
| 6,013,533 | A | * | 1/2000 | Sugasawara | G01R 31/01 |
|||||| 438/10 |
| 6,173,750 | B1 | * | 1/2001 | Davis | H01L 21/67144 |
|||||| 156/707 |
| 2005/0000866 | A1 | * | 1/2005 | Caparro | B07C 5/36 |
|||||| 209/552 |
| 2005/0130333 | A1 | * | 6/2005 | Zhong | H01L 21/67271 |
|||||| 382/145 |
| 2008/0188017 | A1 | * | 8/2008 | Kim | H01L 22/20 |
|||||| 257/E21.531 |
| 2010/0064114 | A1 | * | 3/2010 | Keeth | G11C 5/06 |
|||||| 711/220 |

(Continued)

*Primary Examiner* — Kyle O Logan
(74) *Attorney, Agent, or Firm* — Harrity & Harrity, LLP

(57) ABSTRACT

A die sorter tool may include a first conveyor, and a first lane to receive, from one or more load ports and via the first conveyor, a carrier with a set of dies. The die sorter tool may include a die flip module to receive the carrier from the first lane, manipulate one or more dies of the set of dies by changing orientations of the one or more dies, and return the one or more dies to the carrier after manipulating the one or more dies and without changing positions of the one or more dies within the carrier. The die sorter tool may include a second conveyor, and a second lane to receive, via the second conveyor, the carrier from the die flip module, and provide, via the first conveyor, the carrier to the one or more load ports.

20 Claims, 6 Drawing Sheets

(56) References Cited

U.S. PATENT DOCUMENTS

| | | | | |
|---|---|---|---|---|
| 2011/0038694 A1* | 2/2011 | Khoo | ................ | H01L 21/67271 |
| | | | | 414/222.01 |
| 2013/0285259 A1* | 10/2013 | Han | ........................ | B81C 3/005 |
| | | | | 428/156 |
| 2015/0113203 A1* | 4/2015 | Dancho | .............. | G11C 16/3495 |
| | | | | 711/102 |
| 2015/0357526 A1* | 12/2015 | Huska | ...................... | H01L 33/56 |
| | | | | 438/3 |
| 2018/0068880 A1* | 3/2018 | Yang | ................ | H01L 21/67132 |
| 2018/0198041 A1* | 7/2018 | Peterson | ........... | H01L 21/67144 |

* cited by examiner

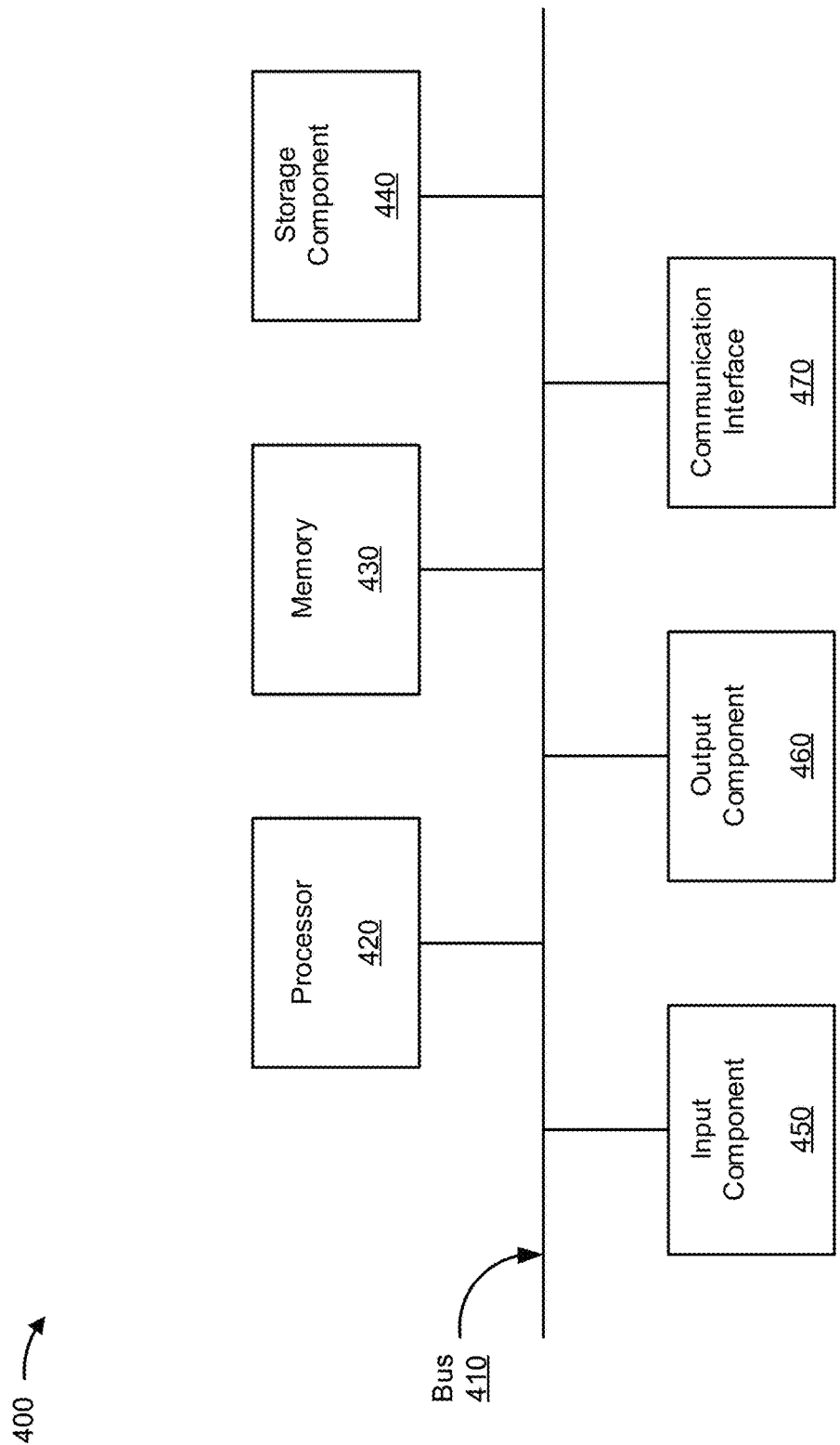

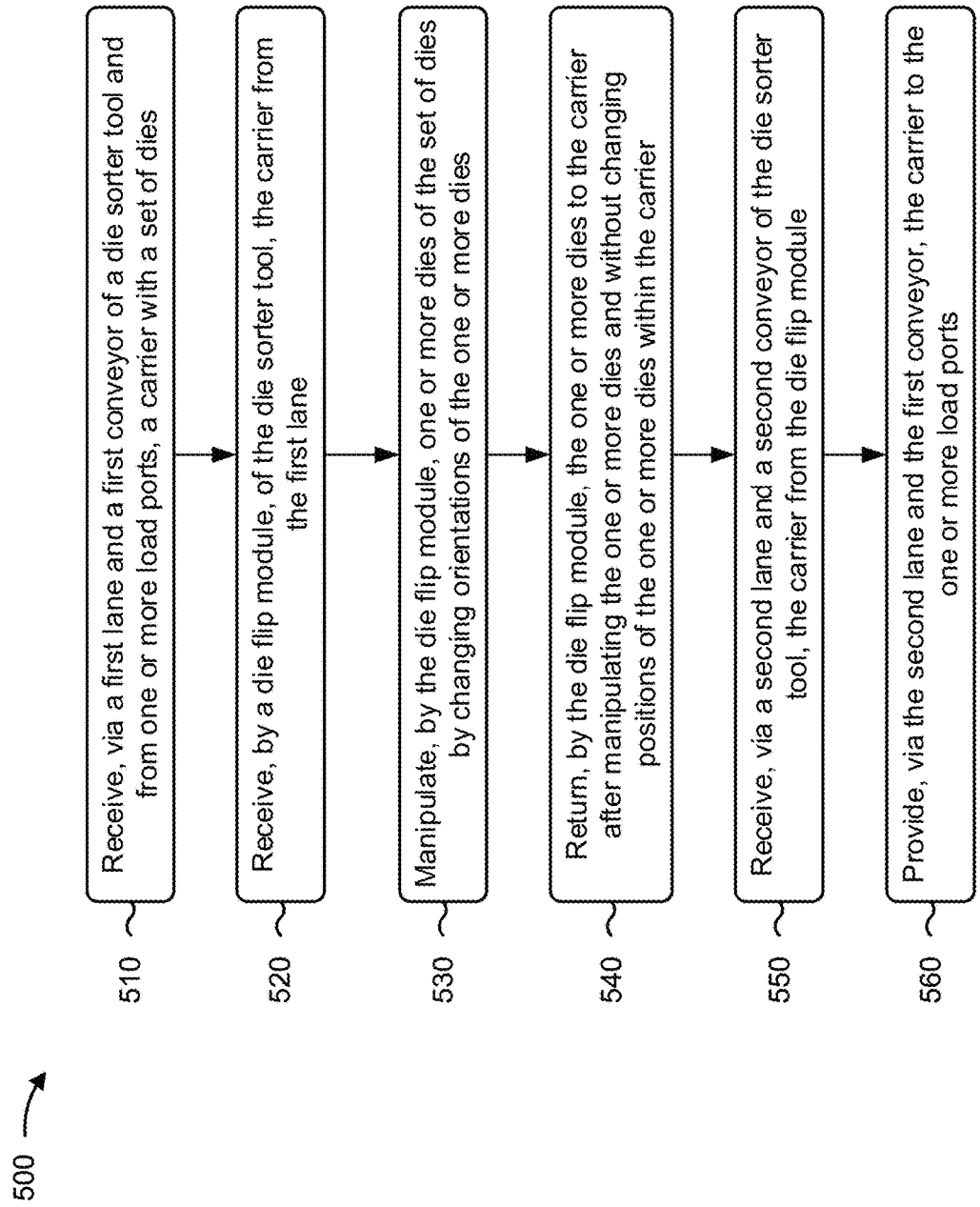

MULTI-FLIP SEMICONDUCTOR DIE SORTER TOOL

BACKGROUND

A die is a small block of semiconductor material on which a functional circuit is fabricated. Typically, integrated circuits are produced in large batches on a single wafer of a semiconductor material through processes such as photolithography. The semiconductor wafer is cut (e.g., diced) into many pieces (e.g., dies), each containing one copy of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a diagram of example components of the multi-flip semiconductor die sorter tool.

FIG. 5 is a flowchart of an example process for manipulating dies with the multi-flip semiconductor die sorter tool.

DETAILED DESCRIPTION

Figure 1A:
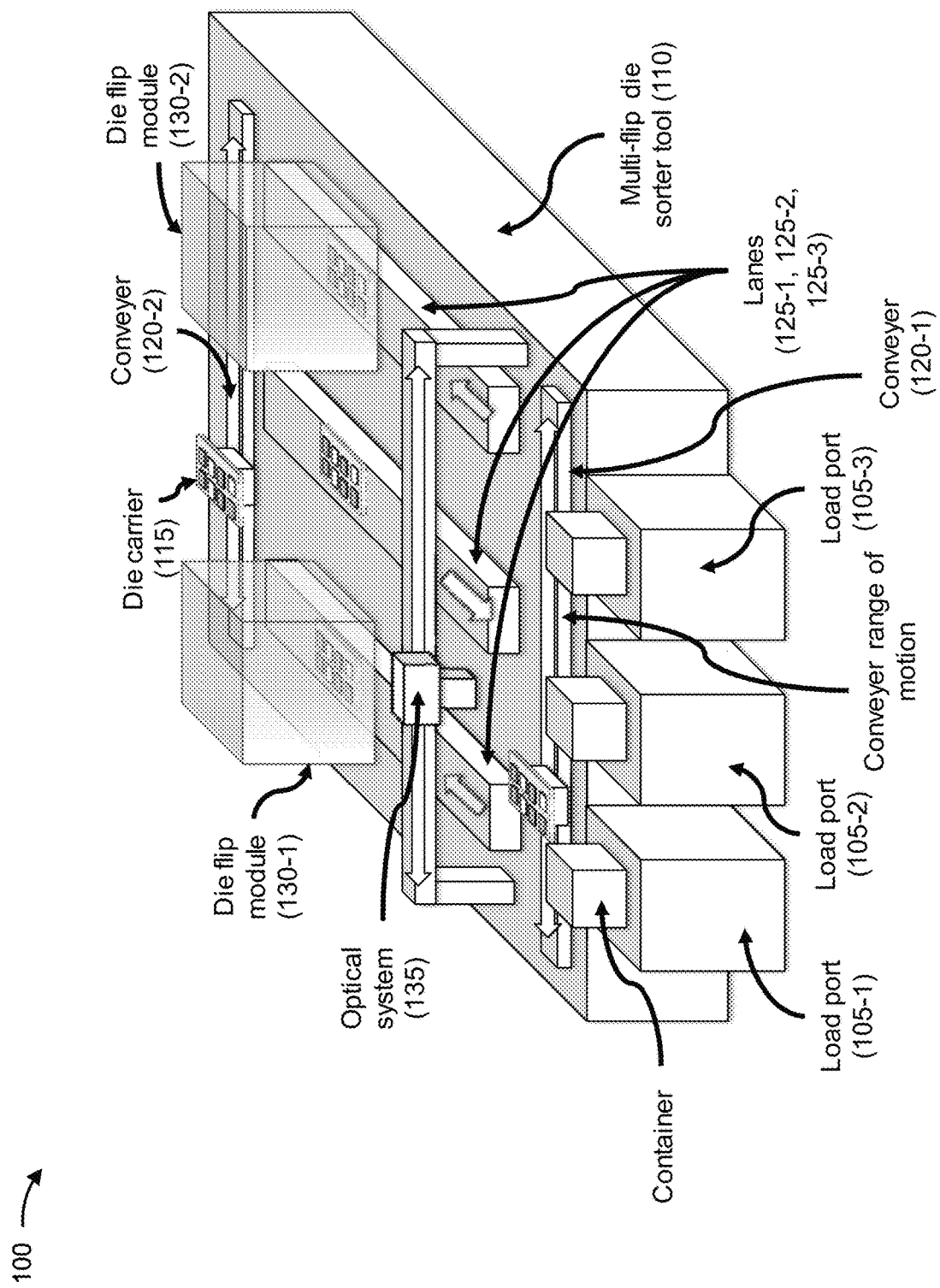
FIGS. 1A-3 are diagrams of an example implementation of a multi-flip semiconductor die sorter tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, a die sorter is used to test and divide dies from one semiconductor wafer into categories of varying qualities or other characteristics. Although all dies on a semiconductor wafer are intended to be identical, this is sometimes not the case. Sorting the die according to characteristics of the die becomes necessary in order to achieve a cost effective, high yield die attach or wire bond production operation. A current die sorter tool receives a carrier (e.g., a boat, a tray, and/or the like) with multiple dies, but is unable to flip (e.g., turn over) one or more dies on a same carrier. Thus, the current die sorter tool flips dies from a first carrier to a second empty carrier. However, such an arrangement requires operators to prepare and load large quantities of empty carriers for the die sorter tool. The current die sorter tool includes a first lane that provides the first carriers (e.g., with dies) to the tool and removes the first carriers from the tool after the dies are removed from the first carriers. The current die sorter tool also includes a second lane that provides the empty second carriers to the tool and removes the second carriers from the tool after the dies are provided to the second carriers. The arrangement of the first lane and the second lane (e.g., a single in and a single out design) prevents the current die sorter tool from continuously operating and causes inefficiencies.

According to some implementations described herein, a multi-flip semiconductor die sorter tool may manipulate dies on a same carrier, and may include multiple lanes for receiving carriers with multiple dies. For example, the multi-flip semiconductor die sorter tool may include a first conveyor, and a first lane to receive, from one or more load ports and via the first conveyor, a carrier with a set of dies. The multi-flip semiconductor die sorter tool may include a die flip module to receive the carrier from the first lane, manipulate one or more dies of the set of dies by changing orientations of the one or more dies, and return the one or more dies to the carrier after manipulating the one or more dies and without changing positions of the one or more dies within the carrier. The multi-flip semiconductor die sorter tool may include a second conveyor, and a second lane to receive, via the second conveyor, the carrier from the die flip module, and provide, via the first conveyor, the carrier to the one or more load ports.

In this way, the multi-flip semiconductor die sorter tool may manipulate dies on a same carrier. In some implementations, the multi-flip semiconductor die sorter tool may include multiple lanes (e.g., two or more lanes) for receiving carriers with multiple dies. For example, the multi-flip semiconductor die sorter tool may include a first die flip module and a second die flip module. The first die flip module may flip dies from a first carrier and may return the flipped dies to the first carrier. The second die flip module, independently of and/or substantially concurrently with the first die flip module, may flip dies from a second carrier and may return the flipped dies to the second carrier. The first and second die flip modules may perform die picking, flipping, and placing functions. The multi-flip semiconductor die sorter may include multiple load ports that continuously transfer carriers to the die flip modules. Thus, the multi-flip semiconductor die sorter may prevent damage to dies caused by human handling (e.g., flipping) of the dies, may increase throughput and/or efficiency of die manipulation functions, and/or the like.

Figure 1B:
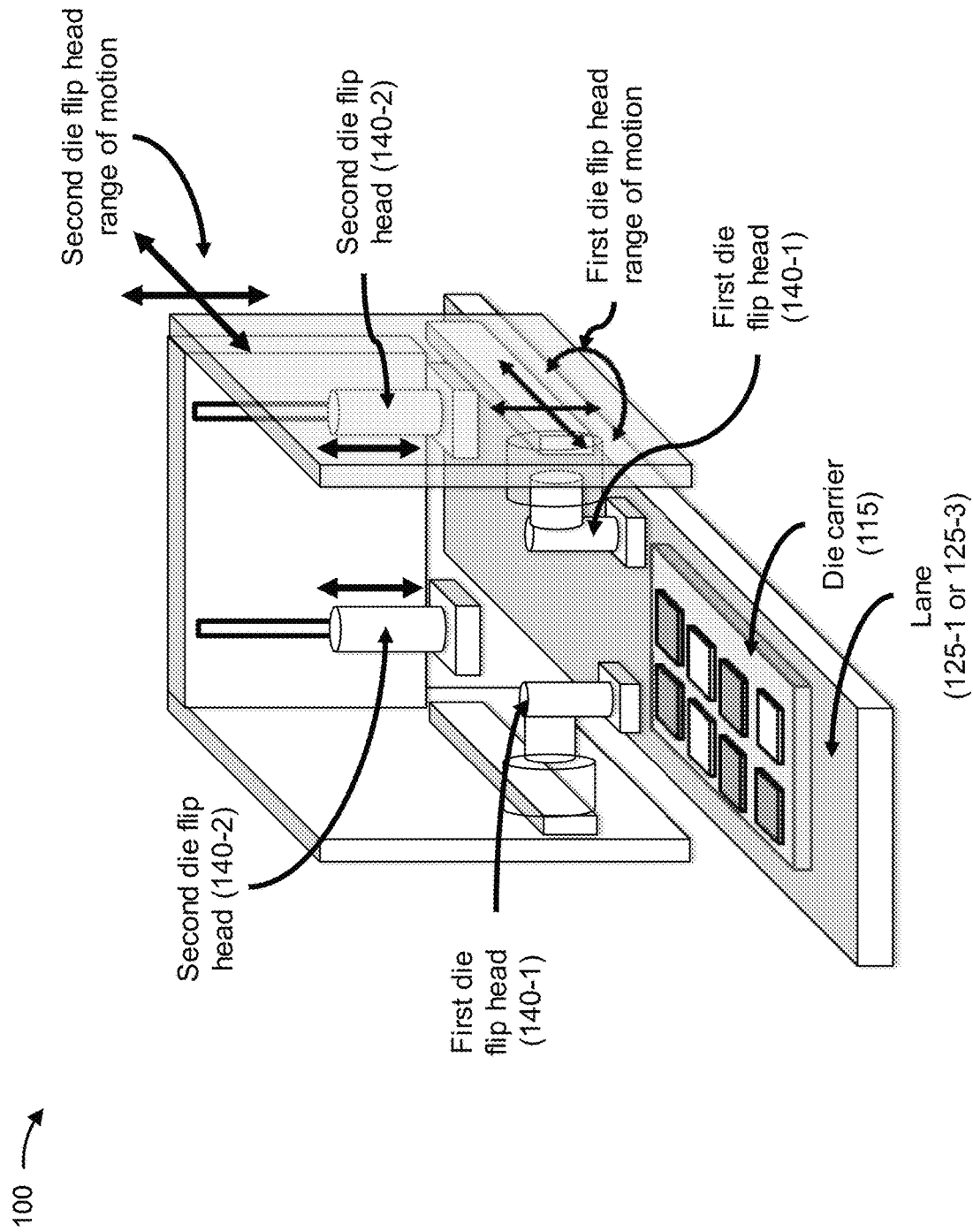

FIGS. 1A and 1B are diagrams 100 of a multi-flip semiconductor die sorter tool described herein. As shown in FIG. 1A, multiple load ports 105-1, 105-2, and 105-3 (collectively referred to as load ports 105, or singularly as load port 105) may be associated with a multi-flip die sorter tool 110 and multiple die carriers 115. Multi-flip die sorter tool 110 may include a first conveyor 120-1, a second conveyor 120-2, a first lane 125-1, a second lane 125-2, a third lane 125-3, a first die flip module 130-1, a second die flip module 130-2, and an optical system 135. The description to follow will describe an implementation of a multi-flip die sorter tool that includes two conveyors, three lanes, two die flip modules, and a single optical system and that interacts with three load ports. In practice, a multi-flip die sorter tool may include additional or fewer conveyors, additional or fewer lanes, additional or fewer die flip modules, and/or additional optical systems and/or may interact with additional or fewer load ports.

Load port 105 includes a housing that stores one or more die cassettes. Each die cassette may include a housing that stores multiple die carriers 115. Load port 105 may also include a mechanism (e.g., a conveyor, a robot, and/or the like) that provides die carriers 115 to first conveyor 120-1. In some implementations, load port 105 includes an elevator to transport a die cassette to a height of first conveyor 120-1 to permit the mechanism to provide a die carrier 115 to first conveyor 120-1.

Die carrier 115 includes a tray or other support structure that carries multiple dies. For example, the tray of die carrier 115 may be sized and shaped to carry two or more dies, depending on the size of the dies and/or the size of the tray. Further details of die carrier 115 are described below in connection with FIG. 3.

First conveyor 120-1 includes a mechanical handling device (e.g., a conveyor belt and a handler tray controlled by one or more motors) that moves die carriers 115 from one location to another. For example, the handler tray of first conveyor 120-1 may receive die carrier 115 from a first load port 105-1, a second load port 105-2, or a third load port 105-3, and the conveyor belt of first conveyor 120-1 may align die carrier 115 with first lane 125-1 or third lane 125-3. First lane 125-1 or third lane 125-3 may receive die carrier 115 from the handler tray of first conveyor 120-1, and may provide die carrier 115 to first die flip module 130-1 (e.g., associated with first lane 125-1) or second die flip module 130-2 (e.g., associated with third lane 125-3). As further shown in FIG. 1A, first conveyor 120-1 may include a range of motion that is perpendicular to directions of first lane 125-1, second lane 125-2, and third lane 125-3.

Second conveyor 120-2 includes the features described above for first conveyor 120-1. Furthermore, a handler tray of second conveyor 120-2 may receive a processed die carrier 115 (e.g., with manipulated dies) from first die flip module 130-1 or second die flip module 130-2, and a conveyor belt of second conveyor 120-2 may align the processed die carrier 115 with second lane 125-2. Second lane 125-2 may receive the processed die carrier 115 from the handler tray of second conveyor 120-2, and may provide the processed die carrier 115 to first conveyor 120-1. First conveyor 120-1 may provide the processed die carrier 115 to first load port 105-1, second load port 105-2, or third load port 105-3. For example, the handler tray of first conveyor 120-1 may receive the processed die carrier 115 from second lane 125-2, and the conveyor belt of first conveyor 120-1 may align the processed die carrier 115 with first load port 105-1, second load port 105-2, or third load port 105-3 for receipt.

First lane 125-1, second lane 125-2, and third lane 125-3 (collectively referred to as lanes 125, or singularly as lane 125) include mechanical handling devices (e.g., conveyor belts controlled by motors) to transport carriers 115. First lane 125-1 and third lane 125-3 may transport carriers 115 from load ports 105 (e.g., via first conveyor 120-1) to first die flip module 130-1 and second die flip module 130-2, respectively. Second lane 125-2 may transport carriers 115 from first die flip module 130-1 and/or second die flip module 130-2 (e.g., via second conveyor 120-2) to load ports 105 (e.g., via first conveyor 120-1). Although first lane 125-1 and third lane 125-3 are shown as transporting carriers 115 to first die flip module 130-1 and second die flip module 130-2, in some implementations, first lane 125-1 and second lane 125-2 or second lane 125-2 and third lane 125-3 may transport carriers 115 to first die flip module 130-1 and second die flip module 130-2. In such an arrangement, first lane 125-1 or third lane 125-3 may transport carriers 115 to load ports 105 (e.g., from first die flip module 130-1 and/or second die flip module 130-2 and via second conveyor 120-2 and first conveyor 120-1).

First die flip module 130-1 and second die flip module 130-2 (collectively referred to as die flip modules 130, or singularly as die flip module 130) receive carriers 115 and manipulate dies provided on carriers 115. For example, die flip module 130 may select or pick up dies from carriers 115, may flip the dies, may place the dies back in carriers 115, and/or the like. In some implementations, die flip module 130 manipulates one or more dies in die carrier 115 by changing orientations of the one or more dies, and returns the one or more dies to die carrier 115 after manipulating the one or more dies and without changing positions of the one or more dies within die carrier 115. In other words, die flip module 130 returns the one or more dies to the same positions that those one or more dies occupied in die carrier 115 before being manipulated. In some implementations, die flip module 130 may concurrently or substantially concurrently manipulate two or more dies. In practice, first die flip module 130-1 and second die flip module 130-2 may independently and/or substantially concurrently manipulate dies provided in separate carriers 115. Multi-flip die sorter tool 110 may prevent damage to dies caused by human handling (e.g., flipping) of the dies, may increase throughput and efficiency of die manipulation functions, and/or the like. Further details of die flip modules 130 are described below in connection with FIGS. 1B and 2.

Optical system 135 includes an image capture device (e.g., a camera) that includes a range of motion that is perpendicular to directions of first lane 125-1, second lane 125-2, and third lane 125-3. For example, the camera may be provided on an arm located above lanes 125 and may be connected to a mechanism that moves the camera along the arm and above each of lanes 125. In some implementations, optical system 135 positions the camera above die carrier 115 in first lane 125-1, captures an image of die carrier 115 with the camera, and identifies dies in die carrier 115 based on the captured image (e.g., prior to or after die carrier 115 being provided to first die flip module 130-1). Optical system 135 may position the camera above die carrier 115 in third lane 125-3, may capture an image of die carrier 115 with the camera, and may identify dies in die carrier 115 based on the captured image (e.g., prior to or after die carrier 115 being provided to second die flip module 130-2). Optical system 135 may position the camera above die carrier 115 in second lane 125-2, may capture an image of die carrier 115 with the camera, and may identify dies in die carrier 115 based on the captured image (e.g., prior to die carrier 115 being provided to load ports 105 via first conveyor 120-1). In some implementations, optical system 135 may include a plurality of cameras, such as one or more cameras per lane 125.

FIG. 1B provides an exploded view of die flip module 130 (e.g., first die flip module 130-1 or second die flip module 130-2). As shown, die flip module 130 may include two first die flip heads 140-1 and two second die flip heads 140-2. In some implementations, die flip module 130 may include two first die flip heads 140-1 and two second die flip heads 140-2 since die carrier 115 include two rows of dies, where a first set of first die flip head 140-1 and second die flip head 140-2 manipulates dies in a first row of die carrier 115 and a second set of first die flip head 140-1 and second die flip head 140-2 manipulates dies in a second row of die carrier 115. In some implementations, the sets of first die flip head 140-1 and second die flip head 140-2 may concurrently or substantially concurrently manipulate dies of die carrier 115, may independently manipulate dies of die carrier 115, and/or the like. With regard to FIG. 1B, die flip module 130 is shown as including two first die flip heads 140-1 and two second die flip heads 140-2. In practice, however, die flip module 130 may include a quantity of first die flip heads and/or second die flip heads that is less than or equal to a quantity of rows of dies included in die carrier 115 and, thus, may include additional or fewer first die flip heads and/or second die flip heads than shown in FIG. 1B.

First die flip head 140-1 includes a mechanism (e.g., a robotic arm) this capable of picking up a die from a location in die carrier 115, flipping the die, and providing the flipped die to second die flip head 140-2. As further shown in FIG. 1B, first die flip head 140-1 may include a horizontal range of motion, a vertical range of motion, and a three-hundred and sixty degree range of motion relative to lanes 105 and/or die carrier 115.

Second die flip head 140-2 includes a mechanism (e.g., a robotic arm) that is capable of receiving the flipped die from first die flip head 140-1 and returning the flipped die to the same location in die carrier 115 that the die occupied before being picked up by first die flip head 140-1. As further shown in FIG. 1B, second die flip head 140-2 may include a horizontal range of motion and a vertical range of motion relative to lanes 105 and/or die carrier 115. In operation, first die flip head 140-1 may select a die from a location in die carrier 115, may flip the die, and may provide the flipped die to second die flip head 140-2. Second die flip head 140-2 may return the flipped die to the location in die carrier 115. This process may be repeated for one or more other dies in die carrier 115 (e.g., until all of the dies have been manipulated, until a proper subset of the dies has been manipulated, and/or the like).

As indicated above, FIGS. 1A and 1B are provided merely as one or more examples. Other examples may differ from what is described with regard to FIGS. 1A and 1B.

Figure 2:
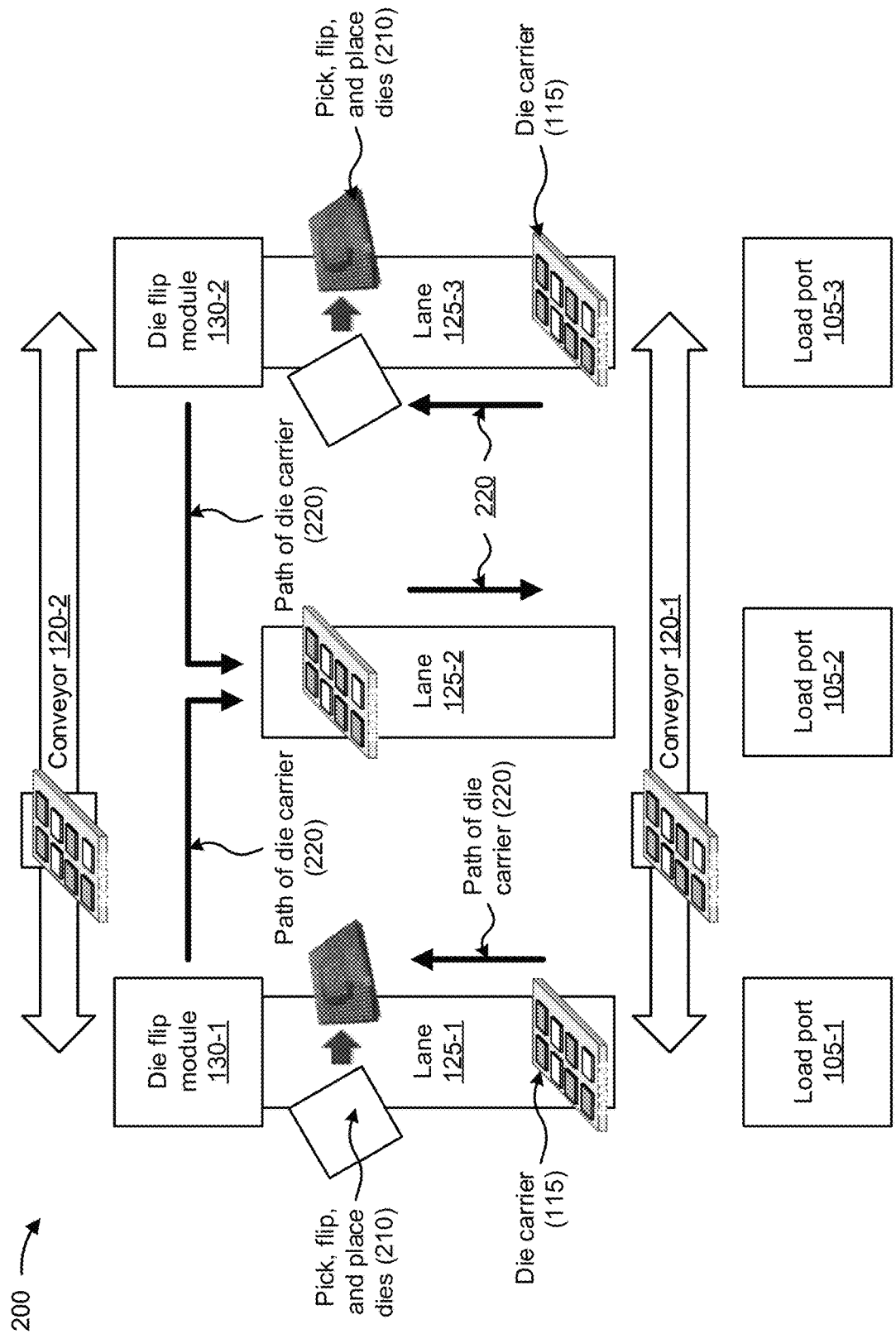

FIG. 2 is a representative diagram 200 of the multi-flip semiconductor die sorter tool described herein. As shown in FIG. 2, first load port 105-1, second load port 105-2, and/or third load port 105-3 may provide a first die carrier 115 and a second die carrier 115 to first conveyor 120-1. First conveyor 120-1 may transport the first die carrier 115 to first lane 125-1, and may transport the second die carrier 115 to third lane 125-3. First lane 125-1 may transport the first die carrier 115 to first die flip module 130-1, and third lane 125-3 may transport the second die carrier 115 to second die flip module 130-2. First die flip module 130-1 may pick, flip, and place dies on the first die carrier 115, as indicated by reference number 210, and second die flip module 130-2 may pick, flip, and place dies on the second die carrier 115, as further indicated by reference number 210.

The paths of the first die carrier 115 and the second die carrier 115 are indicated by the arrows and reference number 220 in FIG. 2. For example, first die flip module 130-1 may cause the first die carrier 115 to be provided to second conveyor 120-2, via first lane 125-1, and second die flip module 130-2 may cause the second die carrier 115 to be provided to second conveyor 120-2, via third lane 125-3. Second conveyor 120-2 may provide the first die carrier 115 and the second die carrier 115 (e.g., consecutively) to second lane 125-2. Second lane 125-2 may provide first die carrier 115 and second die carrier 115 to first conveyor 120-1, and first conveyor 120-1 may provide first die carrier 115 and second die carrier 115 to first load port 105-1, second load port 105-2, and/or third load port 105-3.

As indicated above, FIG. 2 is provided merely as one or more examples. Other examples may differ from what is described with regard to FIG. 2.

Figure 3:
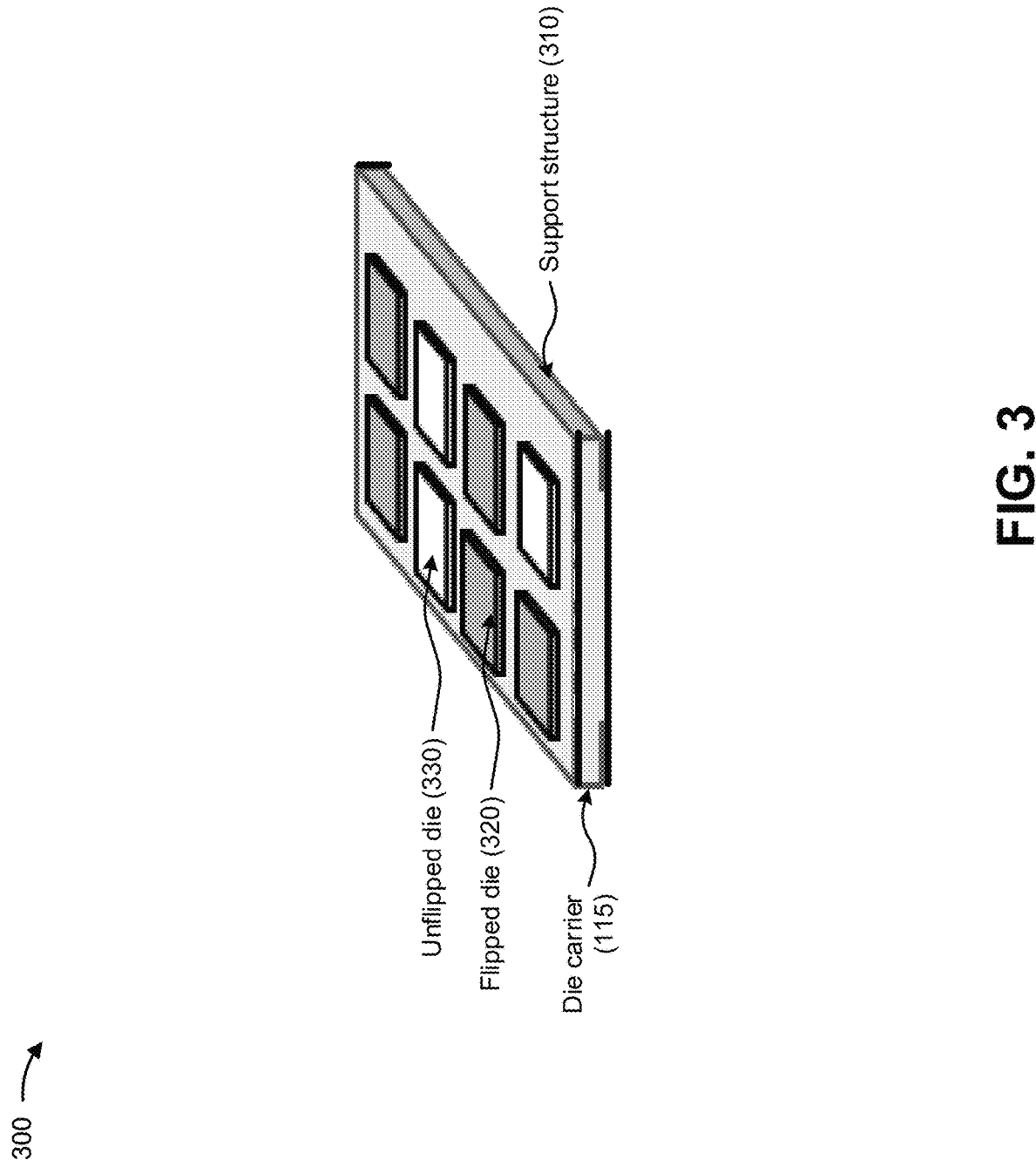

FIG. 3 is a diagram 300 of die carrier 115 utilized with the multi-flip semiconductor die sorter tool described herein. As shown in FIG. 3, die carrier 115 may include a support structure 310 to support multiple dies (e.g., flipped dies 320 and/or unflipped dies 330). Support structure 310 may include a tray with inserts (e.g., representing locations in die carrier 115) sized and shaped to receive and retain dies. For example, support structure 310 may be rectangular to support rows of dies in support structure 310. Support structure 310 may be made from a material (e.g., a plastic, a steel, and/or the like) that is rigid enough to support dies but without damaging dies. Unflipped dies 330 in support structure 310 may be flipped in support structure 310 to provide flipped dies 320.

With regard to FIG. 3, die carrier 115 is shown as including two rows of four dies. In practice, however, die carrier 115 may include additional or fewer rows with a greater or lesser quantity of dies per row than shown in FIG. 3. Also, die carrier 115 is shown as having a rectangular shape. In some implementations, die carrier 115 may have a different shape.

As indicated above, FIG. 3 is provided merely as one or more examples. Other examples may differ from what is described with regard to FIG. 3.

FIG. 4 is a diagram of example components of a device 400. Device 400 may correspond to the multi-flip semiconductor die sorter tool. In some implementations, the multi-flip semiconductor die sorter tool may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among the components of device 400. Processor 420 is implemented in hardware, firmware, or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random-access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a sensor for sensing information (e.g., a global positioning system (GPS) component, an accelerometer, a gyroscope, and/or an actuator). Output component 460 includes a component that provides output information from device 400 (e.g., a display, a speaker, and/or one or more LEDs).

Communication interface 470 includes a transceiver-like component (e.g., a transceiver and/or a separate receiver and transmitter) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, an RF interface, a universal serial bus (USB) interface, a wireless local area interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. A computer-readable medium is defined herein as a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

FIG. 5 is a flow chart of an example process 500 for manipulating dies via picking, flipping, and/or placing. In some implementations, one or more process blocks of FIG. 5 may be performed by a die sorter tool (e.g., the multi-flip semiconductor die sorter tool of FIGS. 1A-3). In some implementations, one or more process blocks of FIG. 5 may be performed by another device or a group of devices separate from or including the die sorter tool. Additionally, or alternatively, one or more process blocks of FIG. 5 may be performed by one or more components of a device 400, such as processor 420, memory 430, storage component 440, input component 450, output component 460, communication interface 470, and/or the like.

As shown in FIG. 5, process 500 may include receiving, via a first lane and a first conveyor of a die sorter tool and from one or more load ports, a carrier with a set of dies (block 510). For example, the die sorter tool may receive, via a first lane and a first conveyor and from one or more load ports, a carrier with a set of dies, as described above.

As further shown in FIG. 5, process 500 may include receiving, by a die flip module of the die sorter tool, the carrier from the first lane (block 520). For example, the die sorter tool may receive, by a die flip module, the carrier from the first lane, as described above.

As further shown in FIG. 5, process 500 may include manipulating, by the die flip module, one or more dies of the set of dies by changing orientations of the one or more dies, (block 530). For example, the die sorter tool may manipulate, by the die flip module, one or more dies of the set of dies by changing orientations of the one or more dies, as described above.

As further shown in FIG. 5, process 500 may include returning, by the die flip module, the one or more dies to the carrier after manipulating the one or more dies and without changing positions of the one or more dies within the carrier (block 540). For example, the die sorter tool may return, by the die flip module, the one or more dies to the carrier after manipulating the one or more dies and without changing positions of the one or more dies within the carrier, as described above.

As further shown in FIG. 5, process 500 may include receiving, via a second lane and a second conveyor of the die sorter tool, the carrier from the die flip module (block 550). For example, the die sorter tool may receive, via a second lane and a second conveyor, the carrier from the die flip module, as described above.

As further shown in FIG. 5, process 500 may include providing, via the second lane and the first conveyor, the carrier to the one or more load ports (block 560). For example, the die sorter tool may provide, via the second lane and the first conveyor, the carrier to the one or more load ports, as described above.

In a first implementation, manipulating the one or more dies of the set of dies by changing orientations of the one or more dies includes picking and flipping, with one or more first die flip heads of the die flip module, the one or more dies from the carrier.

In a second implementation, alone or in combination with the first implementation, returning the one or more dies to the carrier includes receiving, with one or more second die flip heads of the die flip module, the one or more dies from the one or more first die flip heads, and returning, with the one or more second die flip heads, the one or more dies to the carrier.

In a third implementation, alone or in combination with one or more of the first and second implementations, process 500 includes capturing, by an optical system of the die sorter tool, images of the carrier or the set of dies, and identifying the carrier or the set of dies based on the images.

In a fourth implementation, alone or in combination with one or more of the first through third implementations, receiving, via the first lane and the first conveyor of the die sorter tool and from the one or more load ports, the carrier with the set of dies includes receiving the carrier with the set of dies from a magazine provided in the one or more load ports, where the magazine includes a plurality of carriers with sets of dies.

In a fifth implementation, alone or in combination with one or more of the first through fourth implementations, the one or more dies include a plurality of dies, and manipulating the one or more dies includes concurrently manipulating the plurality of dies without changing positions of the plurality of dies within the carrier.

In a sixth implementation, alone or in combination with one or more of the first through fifth implementations, receiving the carrier from the first lane includes transporting the carrier from the first conveyor, through the first lane, and to the die flip module.

In a seventh implementation, alone or in combination with one or more of the first through sixth implementations, manipulating one or more dies of the set of dies by changing orientations of the one or more dies includes removing the one or more dies from the carrier, and flipping the one or more dies.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, the multi-flip semiconductor die sorter tool may manipulate dies on a same die carrier 115, and may include multiple lanes 125 for receiving carriers 115 with multiple dies. For example, the multi-flip semiconductor die sorter tool may include a first die flip module 130-1 and a second die flip module 130-2. First die flip module 130-1 may flip dies from a first die carrier 115 and may return the flipped dies to first die carrier 115. The second die flip module 130-2, independently and/or substantially concurrently with the first die flip module 130-2, may flip dies from a second die carrier 115 and may return the flipped dies to second die carrier 115. The first and second die flip modules 130-1, 130-2 may perform die picking, flipping, and placing functions. The multi-flip semiconductor die sorter may include multiple load ports 105 that continuously transfer carriers 115 to die flip modules 130-1, 130-2. Thus, the multi-flip semiconductor die sorter may prevent damage to dies caused by human handling (e.g., flipping) of the dies, may increase throughput and efficiency of die manipulation functions, and/or the like.

As described in greater detail above, some implementations described herein provide a die sorter tool. The die sorter tool may include a first conveyor, and a first lane to receive, from one or more load ports and via the first conveyor, a carrier with a set of dies. The die sorter tool may include a die flip module to receive the carrier from the first lane, manipulate one or more dies of the set of dies by changing orientations of the one or more dies, and return the one or more dies to the carrier after manipulating the one or more dies and without changing positions of the one or more dies within the carrier. The die sorter tool may include a second conveyor, and a second lane to receive, via the second conveyor, the carrier from the die flip module, and provide, via the first conveyor, the carrier to the one or more load ports.

As described in greater detail above, some implementations described herein provide a method performed by a die sorter tool. The method may include receiving, via a first lane and a first conveyor of a die sorter tool and from one or more load ports, a carrier with a set of dies, and receiving, by a die flip module of the die sorter tool, the carrier from the first lane. The method may include manipulating, by the die flip module, one or more dies of the set of dies by changing orientations of the one or more dies, and returning, by the die flip module, the one or more dies to the carrier after manipulating the one or more dies and without changing positions of the one or more dies within the carrier. The method may include receiving, via a second lane and a second conveyor of the die sorter tool, the carrier from the die flip module, and providing, via the second lane and the first conveyor, the carrier to the one or more load ports.

As described in greater detail above, some implementations described herein provide a die sorter tool. The die sorter tool may include a first conveyor, and a first lane to receive, from one or more load ports and via the first conveyor, a first carrier with a first set of dies. The die sorter tool may include a second lane to receive, from the one or more load ports and via the first conveyor, a second carrier with a second set of dies, and a first die flip module to receive the first carrier from the first lane, remove one or more first dies of the first set of dies from the first carrier, change orientations of the one or more first dies, and return the one or more first dies to the first carrier after changing the orientations of the one or more first dies. The die sorter tool may include a second die flip module to remove one or more second dies of the second set of dies from the second carrier, change orientations of the one or more second dies, and return the one or more second dies to the second carrier after changing the orientations of the one or more second dies. The die sorter tool may include a second conveyor, and a third lane to receive, via the second conveyor, the first carrier from the first die flip module and the second carrier from the second die flip module, and provide, via the first conveyor, the first carrier and the second carrier to the one or more load ports.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A die sorter tool, comprising:
a first conveyor;
a first lane to receive, from one or more load ports and via the first conveyor, a carrier with a set of dies;
a die flip module to:
receive the carrier from the first lane,
manipulate one or more dies of the set of dies by changing orientations of the one or more dies, and
return the one or more dies to the carrier after manipulating the one or more dies and without changing positions of the one or more dies within the carrier;
a second conveyor; and
a second lane to:
receive, via the second conveyor, the carrier from the die flip module, and
provide, via the first conveyor, the carrier to the one or more load ports.

2. The die sorter tool of claim 1, further comprising:
an optical system to capture images of one or more of the carrier or the set of dies for identification.

3. The die sorter tool of claim 1, wherein the die flip module comprises:
one or more first die flip heads to pick the one or more dies from the carrier and to flip the one or more dies; and
one or more second die flip heads to return the one or more dies, after the one or more dies are flipped, to the carrier.

4. The die sorter tool of claim 3, wherein:
the one or more first die flip heads each includes a horizontal range of motion, a vertical range of motion, and a three-hundred and sixty degree range of motion, and
the one or more second die flip heads each includes a horizontal range of motion and a vertical range of motion.

5. The die sorter tool of claim 1, wherein the carrier is a first carrier, the set of dies is a set of first dies, the die flip module is a first die flip module, and the die sorter tool further comprises:
a third lane to receive, from the one or more load ports and via the first conveyor, a second carrier with a set of second dies; and
a second die flip module to:
receive the second carrier from the third lane,
manipulate one or more second dies of the set of second dies by changing orientations of the one or more second dies, and
return the one or more second dies to the second carrier after manipulating the one or more second dies and without changing positions of the one or more second dies within the second carrier,
wherein the second lane is further to:
receive, via the second conveyor, the second carrier from the second die flip module, and
provide, via the first conveyor, the second carrier to the one or more load ports.

6. The die sorter tool of claim 5, wherein the second die flip module comprises:
one or more first die flip heads to pick the one or more second dies from the second carrier and to flip the one or more second dies; and
one or more second die flip heads to return the one or more second dies, after the one or more second dies are flipped, to the second carrier,
wherein:
the one or more first die flip heads each includes a horizontal range of motion, a vertical range of motion, and a three-hundred and sixty degree range of motion, and
the one or more second die flip heads each includes a horizontal range of motion and a vertical range of motion.

7. The die sorter tool of claim 5, wherein the first die flip module and the second die flip module are configured to operate substantially concurrently.

8. The die sorter tool of claim 1, wherein the one or more load ports comprise one or more magazines with a plurality of carriers with sets of dies,
wherein the carrier is one of the plurality of carriers.

9. The die sorter tool of claim 1, wherein the first lane comprises a mechanism to transport the carrier from the die flip module to the second conveyor.

10. The die sorter tool of claim 1, wherein the second lane comprises a mechanism to transport the carrier from the second conveyor to the first conveyor.

11. The die sorter tool of claim 1, wherein the one or more dies includes a plurality of dies and the die flip module is to concurrently manipulate the plurality of dies.

12. A method, comprising:
receiving, via a first lane and a first conveyor of a die sorter tool and from one or more load ports, a carrier with a set of dies;
receiving, by a die flip module of the die sorter tool, the carrier from the first lane;
manipulating, by the die flip module, one or more dies of the set of dies by changing orientations of the one or more dies;
returning, by the die flip module, the one or more dies to the carrier after manipulating the one or more dies and without changing positions of the one or more dies within the carrier;
receiving, via a second lane and a second conveyor of the die sorter tool, the carrier from the die flip module; and
providing, via the second lane and the first conveyor, the carrier to the one or more load ports.

13. The method of claim 12, wherein manipulating the one or more dies of the set of dies by changing orientations of the one or more dies comprises:
picking and flipping, with one or more first die flip heads of the die flip module, the one or more dies from the carrier.

14. The method of claim 13, wherein returning the one or more dies to the carrier comprises:
receiving, with one or more second die flip heads of the die flip module, the one or more dies from the one or more first die flip heads; and
returning, with the one or more second die flip heads, the one or more dies to the carrier.

15. The method of claim 12, further comprising:
capturing, by an optical system of the die sorter tool, images of the carrier or the set of dies; and
identifying the carrier or the set of dies based on the images.

16. The method of claim 12, wherein receiving, via the first lane and the first conveyor of the die sorter tool and from the one or more load ports, the carrier with the set of dies comprises:
receiving the carrier with the set of dies from a magazine provided in the one or more load ports,
wherein the magazine includes a plurality of carriers with sets of dies.

17. The method of claim 12, wherein the one or more dies includes a plurality of dies, and
wherein manipulating, by the die flip module, the one or more dies includes concurrently manipulating, by the die flip module, the plurality of dies without changing positions of the plurality of dies within the carrier.

18. The method of claim 12, wherein receiving, by the die flip module of the die sorter tool, the carrier from the first lane comprises:
transporting the carrier from the first conveyor, through the first lane, and to the die flip module.

19. The method of claim 12, wherein manipulating, by the die flip module, the one or more dies of the set of dies by changing orientations of the one or more dies comprises:
removing the one or more dies from the carrier; and
flipping the one or more dies.

20. A die sorter tool, comprising:
a first conveyor;
a first lane to receive, from one or more load ports and via the first conveyor, a first carrier with a first set of dies;
a second lane to receive, from the one or more load ports and via the first conveyor, a second carrier with a second set of dies;
a first die flip module to:
receive the first carrier from the first lane,
remove one or more first dies of the first set of dies from the first carrier,
change orientations of the one or more first dies, and return the one or more first dies to the first carrier after changing the orientations of the one or more first dies;

a second die flip module to:
receive the second carrier from the second lane,
remove one or more second dies of the second set of dies from the second carrier,
change orientations of the one or more second dies, and
return the one or more second dies to the second carrier after changing the orientations of the one or more second dies;

a second conveyor; and a third lane to:
receive, via the second conveyor, the first carrier from the first die flip module and the second carrier from the second die flip module, and
provide, via the first conveyor, the first carrier and the second carrier to the one or more load ports.

\* \* \* \* \*